United States Patent
Edwards

(10) Patent No.: US 6,169,508 B1
(45) Date of Patent: Jan. 2, 2001

(54) DIGITAL TO ANALOGUE CONVERTER AND METHOD OF OPERATING THE SAME

(75) Inventor: Martin J. Edwards, Crawley (GB)

(73) Assignee: U.S. Philips Corporation, New York, NY (US)

(*) Notice: Under 35 U.S.C. 154(b), the term of this patent shall be extended for 0 days.

(21) Appl. No.: 09/161,850

(22) Filed: Sep. 28, 1998

(30) Foreign Application Priority Data

Nov. 25, 1997 (GB) .................................................. 9724739

(51) Int. Cl.[7] .................................................. H03M 1/66
(52) U.S. Cl. .................................................. 341/150; 341/144
(58) Field of Search .................................................. 341/150, 158, 341/144; 345/94

(56) References Cited

U.S. PATENT DOCUMENTS

| | | | |
|---|---|---|---|
| 4,451,820 | * 5/1984 | Kapral | 341/150 |
| 4,468,654 | * 8/1984 | Kapral | 341/150 |
| 4,584,568 | * 4/1986 | Zomorrodi | 341/150 |
| 5,332,997 | 7/1994 | Dingwall et al. | 341/150 |

* cited by examiner

*Primary Examiner*—Howard L. Williams
*Assistant Examiner*—Jean B. Jeanglaude
(74) *Attorney, Agent, or Firm*—Bernard Franzblau

(57) ABSTRACT

A digital to analogue converter includes at least one capacitor for storing an analogue output voltage resulting from the digital to analogue conversion. The converter further includes an output switch arrangement coupling the at least one capacitor to an output of the converter. The output switch arrangement is operated a plurality of times for each digital to analogue conversion, so that the analogue output voltage is switched to the output of the converter a plurality of times for each digital to analogue conversion. Each switching operation reduces the influence of an output load capacitance on the output signal. As a result smaller components can be used in the converter to achieve a given output signal resolution.

21 Claims, 3 Drawing Sheets

DIGITAL TO ANALOGUE CONVERTER AND METHOD OF OPERATING THE SAME

BACKGROUND OF THE INVENTION

This invention relates to digital-to-analogue (D/A) converters, and in particular to D/A converters in which an analogue output voltage resulting from the digital to analogue conversion is stored on a capacitor or capacitors of the converter. Various types of D/A converter store the analogue output voltage on an output capacitor.

For example, U.S. Pat. No. 5,332,997 discloses a D/A converter using a binary weighted capacitor network. This type of converter relies upon redistribution of charges stored within the capacitor network to arrive at an analogue voltage across the capacitor network which is representative of the digital input signal. This output voltage is then supplied through a buffer as the output of the D/A converter.

A problem with converters of the general type described above, and present in the converter described in U.S. Pat. No. 5,332,997, is the need for an output buffer to isolate the output signal stored on the capacitor (or capacitors) from the output load connected to the converter. Without this buffer, the capacitance of the output load causes attenuation of the output signal. If the capacitance of the output load approaches that of the storage capacitors of the converter, the analogue output voltage of the A/D converter is greatly affected. To reduce this problem, it is possible to increase the size of the storage capacitors in the converter, but this is undesirable from the point of view of layout and cost.

SUMMARY OF THE INVENTION

According to the present invention there is provided a digital to analogue converter comprising at least one capacitor for storing an analogue output voltage resulting from the digital to analogue conversion, the converter further comprising an output switch arrangement coupling the at least one capacitor to an output of the converter, means being provided for operating the output switch arrangement a plurality of times for each digital to analogue conversion, the analogue output voltage thereby being switched to the output of the converter a plurality of times for each digital to analogue conversion.

The converter of the invention switches the analogue signal to the output of the converter a plurality of times for each digital to analogue conversion, and this has the effect of progressively reducing the level of degradation of the output voltage caused by the load capacitance connected to the converter. It is thus possible to omit the conventional buffer amplifier at the output of the converter. There is thus a direct connection of the output switch arrangement to the converter output, meaning the absence of a buffer amplifier therebetween.

The converter may comprise a capacitor network, charges stored within the capacitor network representing a digital input signal. The analogue output voltage of the converter may then result from distribution of charges stored on the capacitors to produce an output voltage across the capacitor network. The invention is thus applicable to charge redistribution converters.

In one type of charge redistribution converter, the digital input comprises a plurality of parallel input bits, and the capacitor network comprises a binary weighted capacitor network, input bits being supplied through an associated coupling switch to one terminal of an associated capacitor of the capacitor network, the other terminals of the capacitors being connected together to a common line, the level of an input bit determining the voltage across the associated capacitor and thereby the charge stored thereon.

In another type of charge redistribution converter, the digital input comprises a plurality of serial input bits, and the capacitor network then comprises two equal-valued capacitors with first switching means enabling one of the capacitors to be charged or discharged depending upon the level of the incoming input bit, and second switching means enabling the charges stored on the two capacitors to be shared. The invention may be applied to this type of converter using a serial charge redistribution technique.

The invention can also be applied to other types of converter, provided the analogue voltage is stored on a capacitor or capacitors of the converter. In each case, the invention avoids the need for an output amplifier to isolate the converter capacitors from the load, which would otherwise be required in order to prevent the load from affecting the accuracy of the conversion.

The invention also provides a liquid crystal display comprising an array of liquid crystal pixels addressed by a row driver circuit and a column addressing circuit, the column addressing circuit comprising a plurality of digital to analogue converters of the invention.

Additionally, the invention provides a method of operating a digital to analogue converter, the converter comprising at least one capacitor for storing an analogue output voltage resulting from the digital to analogue conversion, the converter further comprising an output switch arrangement coupling the at least one capacitor to an output of the converter, the method comprising:
(i) generating an analogue voltage across the at least one capacitor depending upon the digital input signal and switching the analogue voltage to the output of the converter using the output switch arrangement;
(ii) isolating the output of the converter from the at least one capacitor using the output switch arrangement; and
(iii) repeating at least once steps (i) and (ii) for each digital to analogue signal conversion.

BRIEF DESCRIPTION OF THE DRAWINGS

The invention will now be described by way of example, with reference to, and as shown in the accompanying drawings, in which.

DESCRIPTION OF THE PREFERRED EMBODIMENTS

Figure 1:
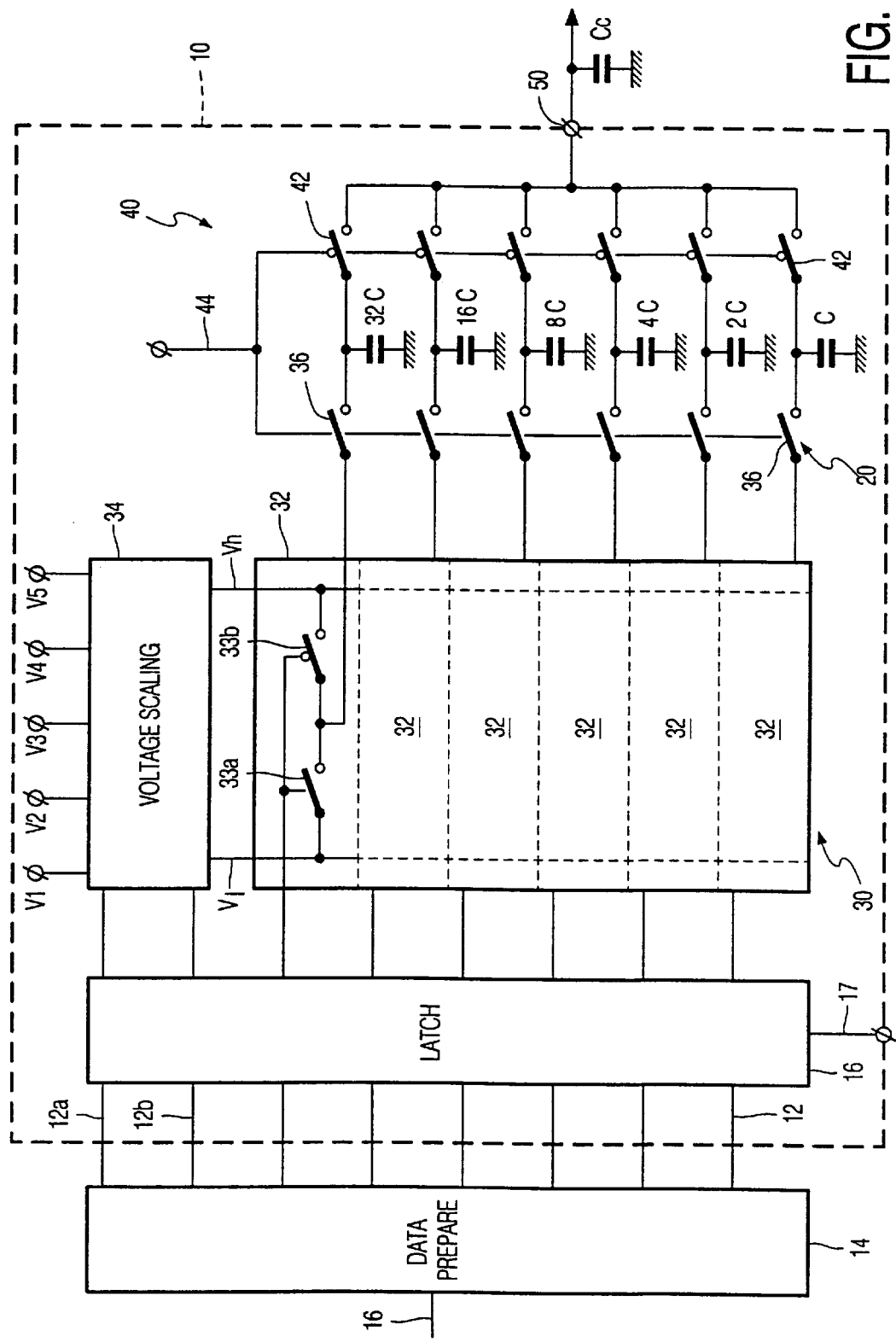
FIG. 1 shows a digital to analogue converter of the invention using a binary weighted capacitor network.

FIG. 1 shows a digital to analogue converter 10 including a binary weighted capacitor network 20, a network 30 of coupling switching devices 32 and an output switch arrangement 40.

The converter 10 receives a plurality of digital inputs 12 in parallel form from a data preparation circuit 14 which may itself have a serial data input 16 as shown in FIG. 1. In one possible use of the converter of the invention, the data preparation circuit 14 and the digital to analogue converter 10 together comprise a column driver for a liquid crystal display.

The data inputs 12 are supplied to a latch 16 which is triggered by a control line 17 to accept data from the inputs 12 at a specified time. The inputs 12 may form a bus supplying data to a plurality of D/A converters, and the control line 17 may be connected to a clocking signal. The latch provides output signals which are suitable for the remainder of the converter circuit. These outputs are then supplied to the network 30 of coupling switching devices 32. In the example shown in FIG. 1, an eight bit digital to analogue converter is shown, but only the six least significant bits of the digital signal are supplied to the switching network 30. The two most significant bits 12a, 12b are supplied to a voltage scaling circuit 34. The voltage scaling circuit 34 enables the digital to analogue conversion to be made non-linear, which may have advantages for the addressing of liquid crystal display pixels, for example.

The voltage scaling circuit 34 receives five voltage inputs V1 to V5, and a pair of these voltage levels Vh, Vl is supplied to the switching network 30 depending upon the digital levels of the two most significant bits 12a, 12b of the digital input signal. Each switching device 32 couples a respective output of the switching network 30 to one or other of the voltage lines Vh, Vl supplied by the voltage scaling circuit 34.

As shown in FIG. 1, each switching device 32 comprises a pair of series connected switches 33a, 33b coupled between the two voltage lines Vh, Vl, with the output of the switching device 32 connected to the point of connection of the two switches 33a, 33b. The operation of the two switches 33a, 33b is complementary so that the output is connected to one or the other of the voltage lines Vh, Vl. Each output from the switching network 30 is supplied through a respective charging switch 36 to a first terminal of an associated capacitor C, 2C, 4C, 8C, 16C, 32C of the binary weighted capacitor network 20. The second terminal of each capacitor is connected to ground. The first terminal of each capacitor is also connected through an associated output switch 42 to the output 50 of the converter 10. The output switches 42 and the charging switches 36 are operated simultaneously, and in complementary manner. The output 50 of the converter 10 is connected to the load which has been represented in FIG. 1 as a capacitor $C_C$ representing the column capacitance of a liquid crystal display panel.

The timing of signals provided to the output 50 of the converter 10 depends upon the operation of the output switches 42 which is governed by a control line 44. In practice, the control line represents a clock signal which is synchronised with the timing of the row addressing circuit of the liquid crystal display and with the control line 17 of the latch 16.

The operation of the circuit shown in FIG. 1 will now be described. The data entered into the latch is fed through the latch 16 into the network 30 of coupling switching devices 32 and the voltage scaling circuit 34. Each digital data line is supplied to an associated switching device 32 as the switching control signal for the two complementary switches 33a, 33b. For example, if the digital input to a switching device 32 is a logical high, then one switch, for example 33b, will close and the other 33a will open. As a result, the voltage on the line Vh will be supplied as the output of the switching device 32. Conversely, if the input to a switching device 32 is low, the switch 32a will close and consequently the voltage on the line Vl will be supplied as the output of the switching device 32. Thus, each switching device 32 transfers the voltage from one or the other of the two control lines Vh, Vl to the output. As described above, the voltages on the two control lines are dependent upon the two most significant bits supplied from the latch 16. As one example, $V_1$=0 V, $V_2$=5 V, $V_3$=9 V, $V_4$=12.5 V and $V_5$=15 V. The voltage scaling circuit 34 then provides on the lines Vh and Vl the following possible combinations: 0 V and 5 V, 5 V and 9 V, 9 V and 12.5 V, 12.5 V and 15 V.

During a capacitor charging stage, the charging switches 36 are each closed so that the output voltages from the network 30 of switching devices are each supplied to a respective capacitor C, 2C, 4C, 8C, 16C, 32C of the binary weighed capacitor network 20. Each capacitor is thereby charged to a potential corresponding to one or the other of the control line voltages Vh, Vl. Once this charging has taken place, the total charge stored in the capacitor network 20 is representative of the digital input signal. The coupling switches 36 are then opened by the control line 44 and the output switches 42 are closed. Thus, all capacitors are connected in parallel and charge redistribution takes place so that a common voltage is defined across the capacitor network. This common voltage is determined from the total charge stored within the network 20 of capacitors, and thereby represents the digital input signal.

In the absence of any load connected to the output 50 of the converter 10, the resulting voltage across the capacitor network would provide a direct representation of the digital input signal. This analogue signal is conventionally supplied to the output of the converter through an isolating output amplifier required in order to prevent the load from affecting the accuracy of the conversion.

However, it is desirable to avoid the need for an output amplifier in order to reduce the complexity of the converter circuit 10. If the output amplifier is omitted, the analogue output voltage is degraded by the capacitance of the output load because additional charge sharing takes place. If the converter 10 is to be used in a column driver circuit of a liquid crystal display panel, the output load comprises a column of pixels of the array. In this case, the capacitance of the load $C_C$ can not accurately be measured, and varies between columns of the array due to imperfections in the processing technology. Consequently, the affect of the capacitance $C_C$ can not accurately be determined in order to enable reliable interpretation of the output voltage. The effect of the output capacitance becomes more pronounced the greater the value of the load capacitance $C_C$, and in particular the relative magnitude of the load capacitance $C_C$ with respect to the capacitors in the binary weighted capacitor network 20 is critical. One possible way to reduce the affect of the output capacitance $C_C$ is to use larger capacitors in the network 20, but with a consequent increase in cost and size of the converter circuit 10.

In the converter 10 of the invention, the control line 44 is pulsed a plurality of times for each digital to analogue conversion. Thus, after the first charge redistribution within the capacitor network as described above, the output switches 42 are re-opened and the charging switches 36 re-closed. This has the effect of isolating the output, thereby holding the output voltage on the output, and restoring the charges on the capacitors in the network 20, so that once again each capacitor is charged to the voltage of one or other of the control lines Vh, Vl. After a sufficient time has elapsed for charging or discharging of the capacitors in the binary weighted capacitor network 20, the control line 44 is again pulsed to close the output switches 42 and re-open the charging switches 36. Charge sharing thus takes place again between the capacitors in the network 20 and the output capacitance $C_C$, and as a result of the charge already stored on the output capacitance $C_C$, the error in the analogue output voltage is reduced. This operation is repeated a selected number of times and the error in the output voltage is reduced as the output voltage iteratively approaches the correct level.

The number of cycles of the converter 10 required for each digital to analogue conversion dictates the frequency of the control signal on the control line 44. The number of cycles required will be selected according to the required accuracy of the output voltage level. The number of cycles required will also depend upon the relative value of the maximum capacitance of the load $C_C$ and the values of the capacitors in the binary weighted network 20. The required error in the output voltage will normally be less than half of the voltage corresponding to the least significant bit of the digital signal.

In the converter of the invention, the switches may be arranged as MOS transistors and may each, for example, comprise a PMOS, and an NMOS transistor connected in parallel having complementary gate control signals. The invention may be applied as a modification to existing designs of digital to analogue converters by introducing an additional output switch arrangement. This then enables the size of the capacitors used in the previous circuit design to be reduced by a factor depending upon the number of cycles introduced for each digital to analogue conversion.

In the example described above, the charges stored on the selected capacitors of the weighted network are shared between all capacitors of the network to obtain the analogue output voltage. However, in a different arrangement of the binary weighted capacitor network an additional output capacitor is provided, which is initially charged to a predetermined level. The charge on the output capacitor is then reduced by charge sharing with only selected capacitors of the weighted network to obtain the analogue output voltage. The output voltage can again be supplied through an output switch arrangement to the output of the converter in order to enable operation in accordance with the invention.

Figure 2:
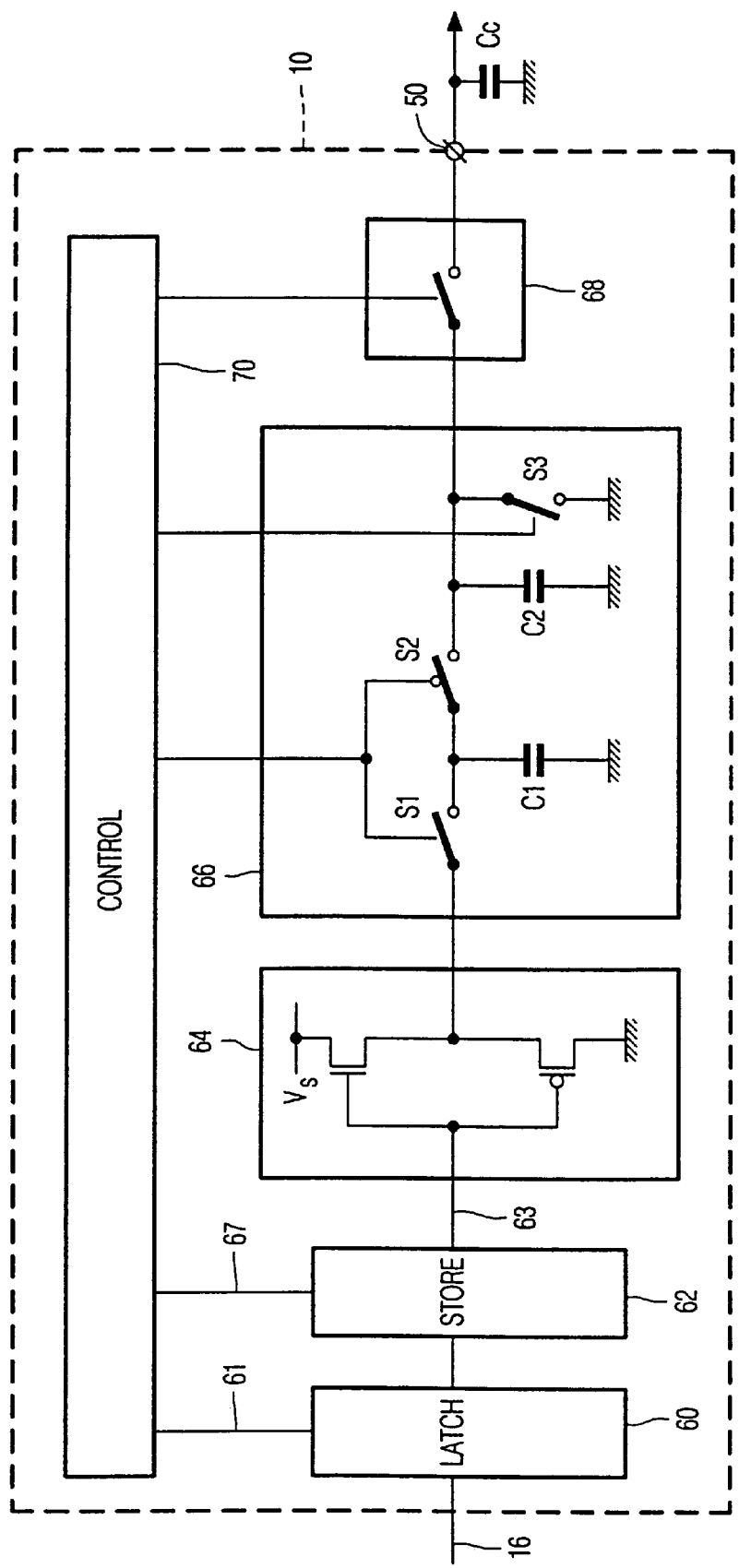
FIG. 2 shows a digital to analogue converter relying upon serial charge redistribution.

FIG. 2 shows a digital to analogue converter 10 according to the invention and relying upon serial charge redistribution. A serial input 16 is supplied to a latch 60 which again is triggered by a control line 61 to receive data from a data bus carrying the serial data to the input 16. The latch provides an output having appropriate signal characteristics for the remainder of the converter circuitry. The latched signal is supplied to a store 62, for reasons explained in the following. The output 63 of the store 62 is supplied to a coupling switch 64 which provides two possible output voltage levels, depending upon the digital value of the signal 63. In the example shown, the output of the switch 64 can be the supply voltage $V_S$ or ground. The capacitor network 66 comprises two parallel capacitors C1, C2 connected together by a switch S2. The input to the first capacitor C1 is also by means of a switch S1 which is operated with a complementary signal to the switch S2. A further switch S3 connects the second capacitor C2 to ground potential to enable discharging of that capacitor. The output of the switching network 66 is supplied to the output 50 of the converter 10 through an output switch 68. Again, the output is assumed to be connected to a capacitive load $C_C$. The timing of the operation of the switches S1, S2, S3 and 68 is under the control of a control unit 70 which can also instruct the store 62 to repeat the serial data for a particular digital to analogue conversion, using a repeat control line 67.

The operation of the circuit shown in FIG. 2 will now be described. While the input data is being latched into the D/A converter, in conventional manner, and being stored in the store 62, the data can pass to the remainder of the circuit of digital to analogue conversion. The conversion may take place while data is being received serially, or after reception of the complete digital word.

As stated above, the output of the coupling switch 64 has two possible voltage levels depending upon the level of the digital input signal 63. During a charging period switch S1 is closed and switch S2 is open, and as a result capacitor C1 charges (or is discharged) to one of the two voltage levels, $V_S$ or ground. In a subsequent charge sharing mode the charge stored on capacitor C1 is shared between capacitors C1 and C2 by closing switch S2 and opening switch S1.

Subsequently, switch S1 is re-closed and switch S2 is re-opened for admission of the next bit of the serial data input. Capacitor C1 is then again charged or discharged according to the input signal, and once again charge sharing takes place between capacitors C1 and C2. This procedure is repeated for all serial data bits and, in known manner, the resulting charge after the final sharing operation provides an analogue representation of the serial digital input signal. In accordance with the invention, this analogue output voltage is then switched by means of the output switch 68 to the output 50 of the converter, and this results in charge sharing between the capacitors C1, C2 and the output capacitance $C_C$. In the same way as for the circuit of FIG. 1, the output switch 68 is then opened to isolate the output, and the procedure is repeated. This requires the capacitor C2 to be discharged by closing switch S3 and the store 62 is commanded by the control 70 using repeat control line 67 to retransmit the serial data input. Again, the number of times this procedure is repeated will dictate the error on the analogue output voltage signal and is again selected depending upon the relative values of the output capacitance $C_C$ and the capacitors C1, C2 of the capacitor network 66.

The possible circuit constructions for the latches and data stores referred to above will be evident to those skilled in the art, and are not described in detail. Typically, the latches comprise bistable switching devices (such as flip-flops). The capacitor networks, in which charge sharing takes place, may also have specific configurations other than those shown in the figures.

The invention may equally be applied to other digital to analogue converter arrangements, in which the analogue output is held on an output capacitor of the converter. For example, one known D/A converter to which the invention may be applied comprises a binary weighted network of current sources, each coupled through an associated switch to a shared storage capacitor. Each bit of the digital input signal is associated with one of the switches, and the digital to analogue conversion involves closing selected switches for a fixed time duration, so that the current sources either contribute a known quantity of charge to, or are isolated from, the storage capacitor. The resulting charge stored on the capacitor is then representative of the digital input.

The invention thus has general applicability to a wide range of known digital to analogue converters, and it will be evident to those skilled in the art to which existing arrangements the invention may be applied.

Figure 3:
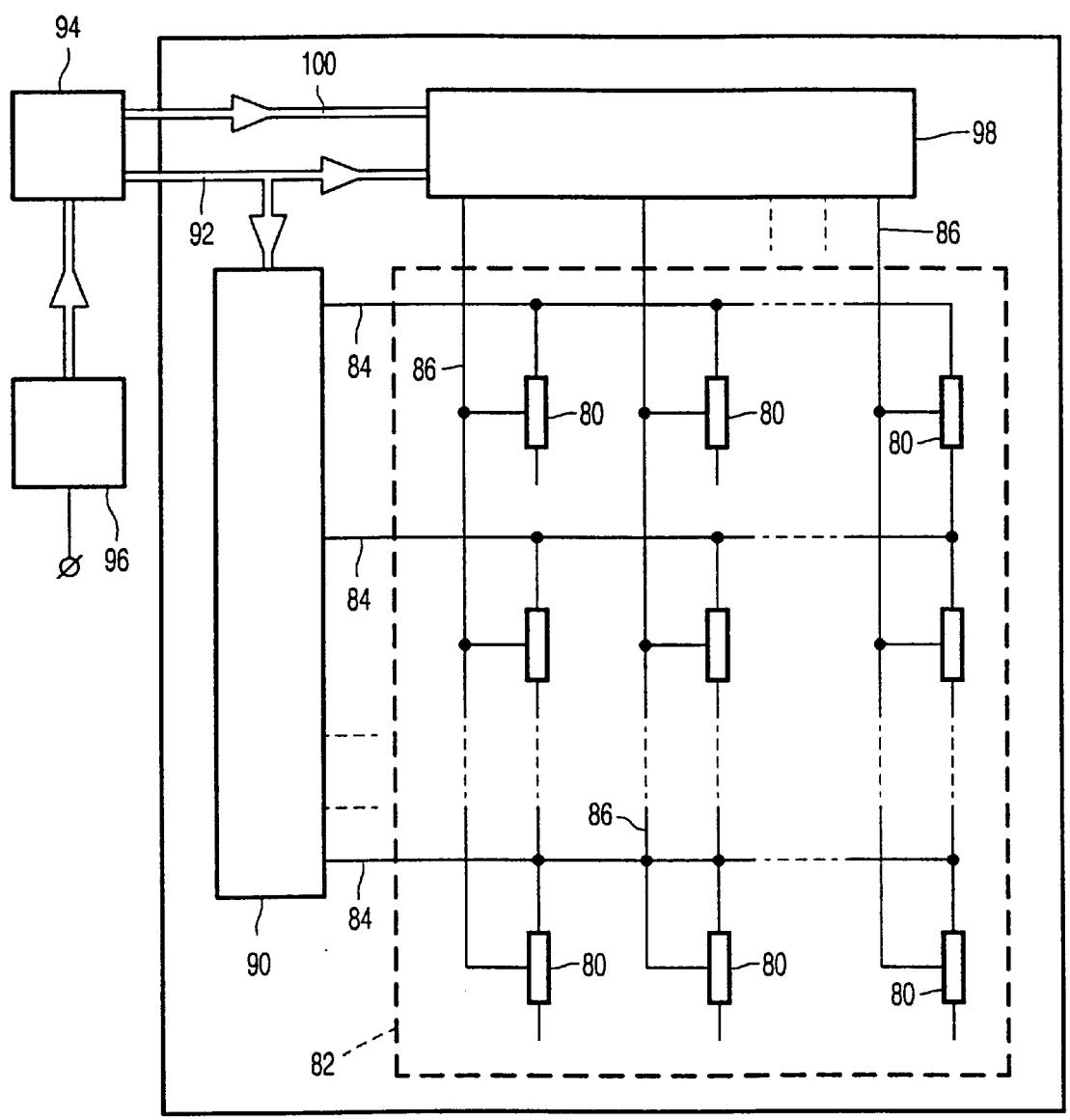
FIG. 3 shows a display addressed using digital to analogue converters of the invention.

FIG. 3 shows a liquid crystal display which can be addressed using a column addressing circuit having digital to analogue converters of the invention. The liquid crystal device comprises a display panel having a row and column array of liquid crystal picture elements 80 defining a display area 82. The picture elements 80 include capacitive display elements comprising spaced electrodes carried respectively on the opposing surfaces of two spaced glass substrates with TN liquid crystal material disposed therebetween.

The picture elements 80 of the array are addressed via sets of row and column address conductors 84 and 86, each picture element being located adjacent a respective intersection of the row and column conductors. Each row of picture elements is connected to a respective row conductor 84 and all picture elements in the same column are connected to a respective column conductor 86.

The array is driven by peripheral drive means including a row driver circuit 90 which scans the row of picture elements and provides a selection (gating) pulse to each row conductor in turn. The row driver circuit 90 is controlled by timing signals provided along a bus 92 from a timing and control circuit 94 to which a digital video signal is supplied from a video signal processing circuit 96.

The peripheral circuitry further includes a column drive circuit 98 to which the video information signal is supplied by the circuit 94 along a bus 100. The column drive circuit operates to apply to the set of column conductors analogue signals in parallel for each row of display pixels in turn. The column drive circuit 98 may comprise, for each column, a digital to analogue converter as described previously. The data is supplied in serial form along the bus 100, and the latches 16 or 60 of each D/A converter are operated in turn to store the correct signal from the bus 100. Once the data signals for each column have been stored in latches of the D/A converters, the switching operations for the D/A conversion are performed simultaneously.

The column drive circuit may additionally comprise an analogue multiplexer, so that the serial digital data from the bus 100 is converted to analogue form by a reduced number of D/A converters of the invention. The multiplexer stores the analogue signals and is then controlled to apply the appropriate analogue signals to the column conductors. This arrangement would conventionally require a buffer amplifier for transferring the analogue output of the D/A converter into the multiplexer circuit, but the use of D/A converters of the invention avoids the need for such amplifiers.

The data bus 100 may comprise three serial data streams, for conveying red, green and blue video data, and in this case the data from the three data streams can be latched simultaneously into groups of three D/A converters. The addressing techniques for a colour liquid crystal display are well known to those skilled in the art, and will not be described in detail.

What is claimed is:

1. A digital to analogue converter comprising: at least one capacitor for storing an analogue output voltage resulting from a digital to analogue conversion, an output switch arrangement coupling the at least one capacitor to an output of the converter, means for operating the output switch arrangement a plurality of times for each digital to analogue conversion, the analogue output voltage thereby being switched to the output of the converter a plurality of times for each digital to analogue conversion.

2. A digital to analogue converter as claimed in claim 1 wherein said at least one capacitor is part of a capacitor network comprising first and second capacitors, the digital to analogue converter further comprising:
   first switching means for selectively coupling the first capacitor to a source of voltage by which the first capacitor is charged or discharged as a function of an input digital signal, and
   second switching means for selectively coupling the second capacitor to the first capacitor thereby to allow charges stored on the first and second capacitors to be shared.

3. A digital to analogue converter as claimed in claim 2 comprising:
   a further switch for selectively coupling the second capacitor to a point of reference voltage, and
   an output switch coupling the capacitor network to the output of the converter.

4. A digital to analogue converter as claimed in claim 3 wherein the first and second switching means are operated in a complementary manner, and
   the output switch is closed at the end of a digital to analogue conversion and remains open during the charge sharing period of the first and second capacitors.

5. A digital to analogue converter as claimed in claim 1 wherein said at least one capacitor is part of a binary weighted capacitor network wherein charges stored in the capacitor network represent a digital input signal, and means providing a direct connection between the capacitor network and the output of the converter.

6. A digital to analogue converter as claimed in claim 5 wherein said direct connection means includes said output switch arrangement.

7. A digital to analogue converter as claimed in claim 1 wherein said at least one capacitor is part of a binary weighted capacitor network wherein charges stored within the capacitor network represent a digital input signal, an analogue output voltage of the converter resulting from distribution of charges stored on the capacitors to produce an output voltage across the capacitor network.

8. A digital to analogue converter as claimed in claim 7 further comprising a network of capacitor charge switches coupled to the capacitor network,
   a network of coupling switches coupling the network of capacitor charge switches to a network of digital input lines, and
   means for simultaneously operating the capacitor charge switches and the output switch arrangement in a complementary manner.

9. A digital to analogue converter as claimed in claim 7 wherein outputs of the output switch arrangement are coupled to a common line to provide said distribution of charges of the capacitor network when the output switch arrangement is closed.

10. A digital to analogue converter as claimed in claim 7 further comprising:
    a network of coupling switches selectively coupling the capacitor network to a first voltage line and to a second voltage line, wherein
    each coupling switch comprises a pair of switches operated in a complementary manner in response to digital input signals.

11. A digital to analogue converter as claimed in claim 7 further comprising a control line for operating a plurality of switches of the output switch arrangement, said control line being pulsed a plurality of times for each digital to analogue conversion.

12. A digital to analogue converter as claimed in claim 11 wherein the frequency of the control pulses on the control line is determined by the desired accuracy of the correspondence of the analogue output voltage to the digital input signal to be converted.

13. A digital to analogue converter as claimed in claim 1, comprising a capacitor network, charges stored within the capacitor network representing a digital input signal, an analogue output voltage of the converter resulting from distribution of charges stored on the capacitors to produce an output voltage across the capacitor network.

14. A digital to analogue converter as claimed in claim 13, wherein the digital input comprises a plurality of parallel input bits, and the capacitor network comprises a binary weighted capacitor network, input bits being supplied through an associated coupling switch to one terminal of an associated capacitor of the capacitor network, the other terminals of the capacitors being connected together to a common line, the level of an input bit determining the voltage across the associated capacitor and thereby the charge stored thereon.

15. A digital to analogue converter as claimed in claim 14, wherein the coupling switch comprises a pair of switches operated using complementary command signals, one switch coupling an output of the coupling switch to a first voltage line and the other switch coupling the coupling switch output to a second voltage line.

16. A digital to analogue converter as claimed in claim 15, wherein at least one of the input bits is supplied to a voltage scaling circuit which determines the voltages on the first and second voltage lines, the remainder of the input bits being supplied to the capacitor network.

17. A digital to analogue converter as claimed in claim 13, wherein the digital input comprises a plurality of serial input bits, and the capacitor network comprises two equal-valued capacitors with first switching means enabling one of the capacitors to be charged or discharged depending upon the level of the incoming input bit, and second switching means enabling the charges stored on the two capacitors to be shared.

18. A digital to analogue converter as claimed in claim 17 wherein the first and second switching means are operated in a complementary manner,-the digital to analogue converter further comprising an output switch coupling the capacitor network to the output of the converter.

19. A digital to analogue converter as claimed in claim 18 further comprising a coupling switch for selectively coupling said one capacitor to first and second voltage lines as determined by the incoming digital input bit.

20. A liquid crystal display comprising an array of liquid crystal pixels addressed by a row driver circuit and a column addressing circuit, the column addressing circuit comprising a plurality of digital to analogue converters at least one of which comprises at least one capacitor for storing an analogue output voltage resulting from a digital to analogue conversion, an output switch arrangement coupling the at least one capacitor to an output of the converter, means for operating the output switch arrangement a plurality of times for each digital to analogue conversion, the analogue output voltage thereby being switched to the output of the converter a plurality of times for each digital to analogue conversion.

21. A method of operating a digital to analogue converter, the converter comprising at least one capacitor for storing an analogue output voltage resulting from the digital to analogue conversion, the converter further comprising an output switch arrangement coupling the at least one capacitor to an output of the converter, the method comprising:

(i) generating an analogue voltage across the at least one capacitor depending upon the digital input signal and switching the analogue voltage to the output of the converter using the output switch arrangement;

(ii) isolating the output of the converter from the at least one capacitor using the output switch arrangement; and (iii) repeating at least once steps (i) and (ii) for each digital to analogue signal conversion.

\* \* \* \* \*